United States Patent
Park (10) Patent No.: US 8,044,516 B2
(45) Date of Patent: Oct. 25, 2011

(54) SEMICONDUCTOR PACKAGE WITH A REDUCED VOLUME AND THICKNESS AND CAPABLE OF HIGH SPEED OPERATION AND METHOD FOR FABRICATING THE SAME

(75) Inventor: Chang Jun Park, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 165 days.

(21) Appl. No.: 11/854,243

(22) Filed: Sep. 12, 2007

(65) Prior Publication Data

US 2009/0039481 A1 Feb. 12, 2009

(30) Foreign Application Priority Data

Aug. 9, 2007 (KR) .................... 10-2007-0080308

(51) Int. Cl.
*H01L 23/488* (2006.01)
(52) U.S. Cl. ........ 257/772; 257/686; 257/698; 257/773; 257/E23.011
(58) Field of Classification Search .......... 257/678–796, 257/E23.001–E23.194, 698, 621, 772, 774
See application file for complete search history.

(56) References Cited

U.S. PATENT DOCUMENTS

| | | | | |
|---|---|---|---|---|
| 2002/0071935 A1* | 6/2002 | Wu | ................... | 428/134 |
| 2004/0266066 A1* | 12/2004 | Wang | ................... | 438/123 |
| 2005/0104228 A1* | 5/2005 | Rigg et al. | ................... | 257/786 |
| 2006/0043535 A1* | 3/2006 | Hiatt | ................... | 257/621 |
| 2006/0043569 A1* | 3/2006 | Benson et al. | ................... | 257/698 |
| 2006/0148250 A1 | 7/2006 | Kirby | | |
| 2006/0197206 A1* | 9/2006 | Kim et al. | ................... | 257/686 |
| 2006/0252232 A1* | 11/2006 | Usui et al. | ................... | 438/460 |

FOREIGN PATENT DOCUMENTS

KR 1020050039132 4/2005

* cited by examiner

*Primary Examiner* — Matthew Landau
*Assistant Examiner* — Latanya N Crawford
(74) *Attorney, Agent, or Firm* — Ladas Parry LLP (57) ABSTRACT

A semiconductor package includes a semiconductor chip provided with a bonding pad disposed over a surface thereof; a through electrode passing from the surface to a second surface opposing the first surface and connected electrically with the bonding pad; and a redistribution disposed at the second surface and connected electrically with the through electrode. An embodiment of the present invention is capable of significantly reducing the thickness and volume of the semiconductor package. It is also capable of high speed operation since the path of the signal inputted and/or outputted from the semiconductor package is shortened. It is capable of stacking easily at least two semiconductor packages having a wafer level, and it is capable of significantly reducing parasitic capacitance.

11 Claims, 9 Drawing Sheets

SEMICONDUCTOR PACKAGE WITH A REDUCED VOLUME AND THICKNESS AND CAPABLE OF HIGH SPEED OPERATION AND METHOD FOR FABRICATING THE SAME

CROSS-REFERENCE TO RELATED APPLICATIONS

The present application claims priority to Korean patent application number 10-2007-0080308 filed on Aug. 9, 2007, which is incorporated herein by reference in its entirety.

BACKGROUND OF THE INVENTION

The present invention relates to a semiconductor package and a method for fabricating the same.

Recently, a development in a semiconductor manufacturing technology has allowed the manufacture of a semiconductor package having a semiconductor device adapted to process more data within a short time.

Generally, a semiconductor device is fabricated through a semiconductor chip fabrication process which includes fabricating semiconductor chips over a silicon wafer formed of high purity silicon, a die sorting process for testing electrically the fabricated semiconductor chips, and a packaging process for packaging a good semiconductor chip.

Recently, due to technical developments in a packaging process, a chip scale package having a size of no other than 100% to 105% of a semiconductor chip size and a stacked semiconductor package in which a plurality of semiconductor chips are stacked as an attempt to enhance data storage capacity and data processing speed.

BRIEF SUMMARY OF THE INVENTION

Embodiments of the present invention are directed to a semiconductor package, in which a volume and a thickness thereof are reduced and which is capable of high speed operation.

In one embodiment, a semiconductor package may comprise a semiconductor chip with a bonding pad; a through electrode formed in the semiconductor chip passing from a first surface to a second surface opposing the first surface, the through electrode being connected electrically to the bonding pad; and a redistribution pattern disposed in the second surface and connected electrically to the through electrode.

The semiconductor chip includes a first insulation pattern disposed over the first surface thereof and the first surface has an opening for exposing the bonding pad.

The semiconductor chip further includes a conductive ball attached to the bonding pad.

The semiconductor chip includes a second insulation pattern disposed over the second surface thereof, and the second insulation pattern has an opening for exposing some portion of the redistribution pattern.

The semiconductor chip further includes a conductive ball attached to the exposed redistribution pattern.

The semiconductor chip has a receiving groove formed in the second surface thereof for receiving the redistribution pattern.

The through electrode projects from a bottom surface of the receiving groove.

The redistribution pattern includes solder.

The through electrode passes through the bonding pad.

The semiconductor chip may include an adhesive member disposed over the second surface of the semiconductor chip.

The semiconductor package may further comprise a substrate having a connection pad connected to the redistribution pattern.

Further, embodiments of the present invention are directed to method for fabricating a semiconductor package, in which a volume and a thickness thereof are reduced and which is capable of high speed operation.

In another embodiment, a method for fabricating a semiconductor package may comprise fabricating a semiconductor chip having a bonding pad in a first surface; forming a through electrode in the chip from the first surface to a second surface opposing the first surface of the semiconductor chip and connected electrically the through electrode to the bonding pad; and forming a redistribution pattern connected electrically to the through electrode over the second surface.

The method for fabricating a semiconductor package may further comprises, before the step of forming the through electrode, forming a first insulation pattern having an opening for exposing the bonding pad over the first surface.

The step of forming the through electrode includes forming a via hole passing through the bonding pad which is formed at a predetermined depth in the semiconductor chip; forming a preliminary through electrode within the via hole, the through electrode being connected electrically to the bonding pad; and polishing the second surface until the preliminary through electrode is exposed.

The step of forming the preliminary through electrode includes attaching a conductive ball electrically connecting electrically the bonding pad to the through electrode.

The step of forming the redistribution pattern includes forming a photoresist pattern having an opening for exposing the through electrode over the second surface of the semiconductor chip; patterning the second surface of the semiconductor chip using the photoresist pattern as an etching mask, and by patterning the second surface forming a receiving groove at the second surface; and filling conductive material in the receiving groove.

The step of filling the conductive material includes providing solder paste to the second surface of the semiconductor chip; and filling selectively the solder paste into the receiving groove.

The step of filling the conductive material further includes reflowing the solder paste filled in the receiving groove.

The method for fabricating a semiconductor package may further comprise, after the step of forming the redistribution pattern,
  forming a second insulation pattern having an opening for exposing a portion of the redistribution pattern.

The method for fabricating a semiconductor package may further comprise forming a conductive ball at the opening.

The method for fabricating a semiconductor package may further comprise, after the step of forming the redistribution pattern, connecting electrically the redistribution pattern to a connection pad of a substrate; and molding the semiconductor chip with a molding member.

When connecting the redistribution pattern to the connection pad, the two may be electrically connected to each other using a conductive ball. Under-fill material is interposed between the redistribution pattern and the connection pad to fill the gap caused by the conductive ball.

DESCRIPTION OF SPECIFIC EMBODIMENTS

Figure 1:
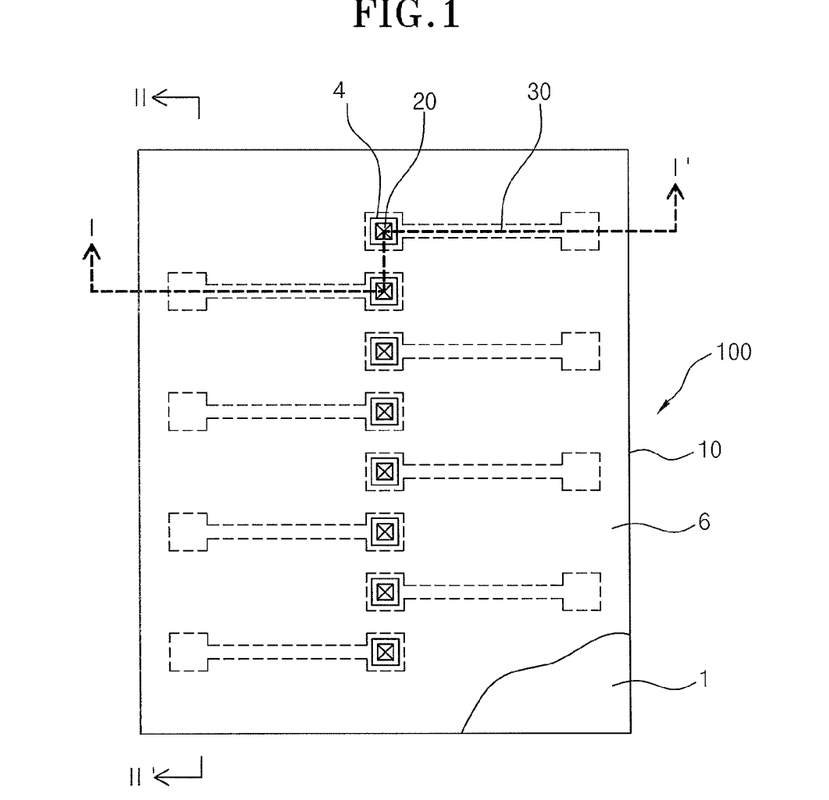
FIG. 1 is a plan view illustrating a semiconductor package in accordance with an embodiment of the present invention.
Figure 2:
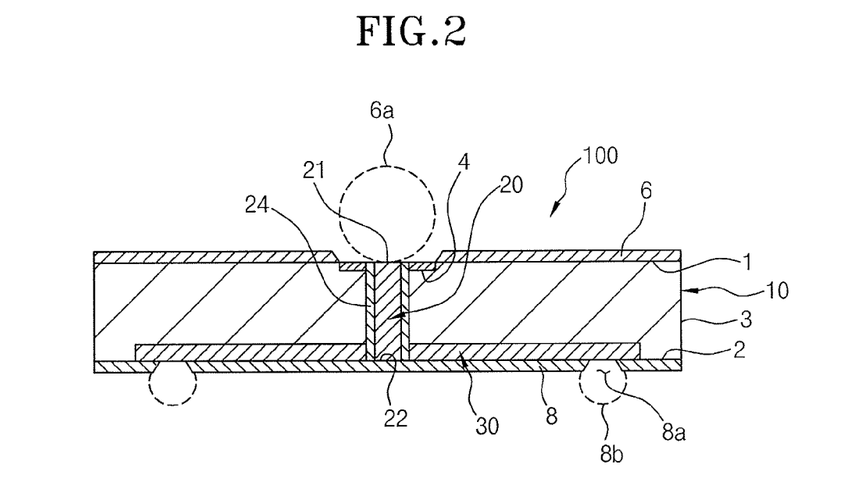
FIG. 2 is a cross-sectional view taken along line I-I' in FIG. 1.
Figure 3:
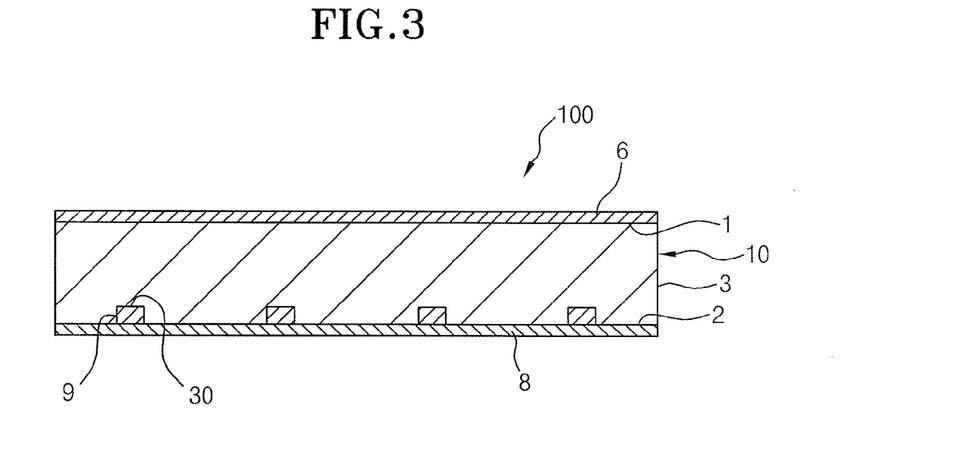
FIG. 3 is a cross-sectional view taken along line II-II' in FIG. 1.
Figure 4:
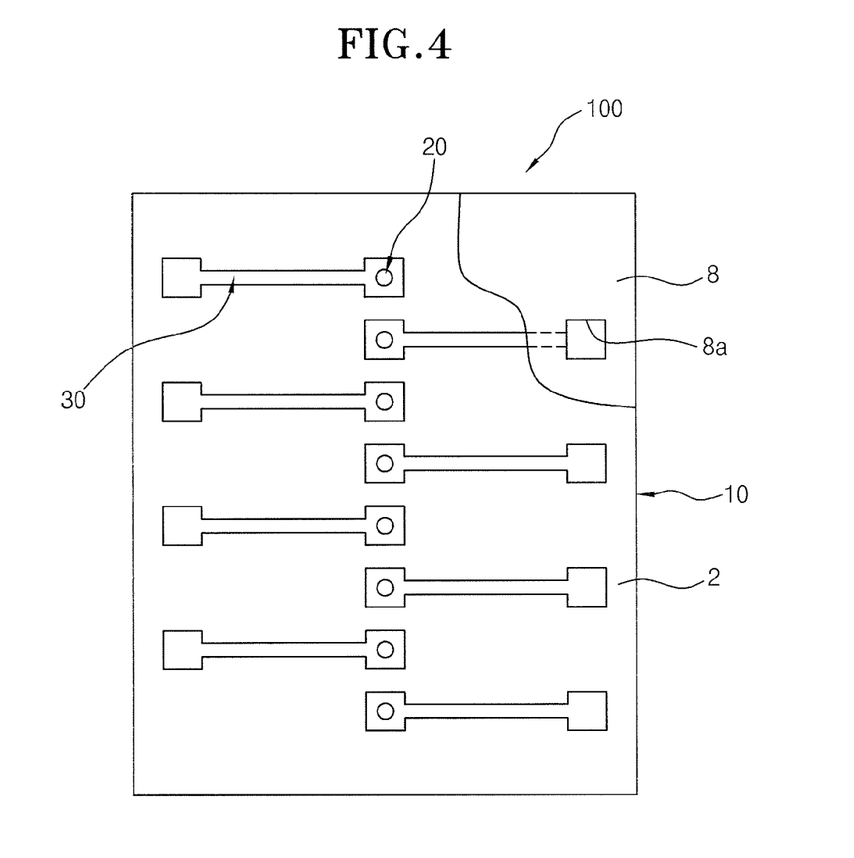
FIG. 4 is a rear view illustrating a rear surface of the semiconductor package shown in FIG. 1.

FIG. 1 is a plan view illustrating a semiconductor package in accordance with an embodiment of the present invention. FIG. 2 is a cross-sectional view taken along line I-I' in FIG. 1. FIG. 3 is a cross-sectional view taken along line II-II' in FIG. 1. FIG. 4 is a rear view illustrating a rear surface of the semiconductor package shown in FIG. 1.

Referring to FIG. 1, the semiconductor package 100 includes a semiconductor chip 10, a through electrode 20, and a redistribution pattern 30. In addition, the semiconductor package 100 may further include a first insulation layer pattern 6, a second insulation layer pattern 8 and conductive balls 6a and 8b.

The semiconductor chip 10 has, for example, a rectangular shape. The semiconductor chip 10 having the rectangular shape has a first surface 1, a second surface 2 opposing to the first surface 1, and side surfaces 3.

The semiconductor chip 10 includes a data storage part (not shown), a data processing part (not shown), and a bonding pad 4.

The data storage part stores data, and the data processing part processes data stored in the data storage part.

The bonding pad 4 is disposed over the first surface 1 of the semiconductor chip 10, and the bonding pad 4 is electrically connected to the data storage part and/or the data processing part. The semiconductor chip has a plurality of bonding pads 4, and the plurality of bonding pads 4 are arranged in a row at the center of the first surface 1 of the semiconductor chip 10.

Examples of material that may be used as the bonding pad 4 include aluminum and aluminum alloy.

Referring to FIG. 2, the first insulation layer pattern 6 may be selectively disposed over the first surface 1 of the semiconductor chip 10. The first insulation layer pattern 6 has an opening for exposing the bonding pad 4. The first insulation layer pattern 6 may be an organic or inorganic layer. A conductive ball 6a may be selectively attached to the bonding pad 4 exposed by the first insulation layer pattern 6. The conductive ball 6a may include a solder.

The through electrode 20 is electrically connected to the bonding pad 4. The through electrode 20 electrically connected to the bonding pad 4 passes from the first surface 1 to the second surface 2 of the semiconductor chip 10.

The through electrode 20 has, for example, a pillar shape. The through electrode 20 includes a first end portion 21 and a second end portion 22 opposing the first end portion 21. The first end portion 21 is electrically connected with the bonding pad 4 of the semiconductor chip 10.

The first end portion 21 of the through electrode 20 may be electrically connected with the bonding pad 4 of the semiconductor chip 10 by passing through the bonding pad 4. Alternatively, the first end portion 21 of the through electrode 20 may be electrically connected to a surface of the bonding pad 4.

In a case of forming the through electrode 20 using a plating method, a seed metal pattern 24 is selectively disposed between the through electrode 20 and the semiconductor chip 10. Examples of material that may be used as the seed metal pattern 24 include copper, titanium, nickel, vanadium, and the like.

Referring to FIGS. 3 and 4, the redistribution pattern 30 is disposed over the second surface 2 of the semiconductor chip 10, and some portion of the redistribution pattern 30 is electrically connected to the second end portion 22 of the through electrode 20 not covered by the is second surface 2 of the semiconductor chip 10.

When disposing the redistribution pattern 30 over the second surface 2 of the semiconductor chip 10, it is possible to significantly reduce the parasitic capacitance formed between the data storage part or the data processing part formed at a vicinity of the first surface 1 of the semiconductor chip 10 and the redistribution pattern 30.

In order to reduce the thickness of the semiconductor package 100 and prevent deflection of the semiconductor package 100, the redistribution pattern 30 may be disposed within a receiving groove 9 formed at the second surface 2 of the semiconductor 10. Example of material that may be used as the redistribution pattern 30 disposed within the receiving groove 9 includes solder and the like.

When disposing the redistribution pattern 30 within the receiving groove 9, the second end portion 22 of the through electrode 20 projects from the second surface of the semiconductor chip 10 by a depth of the receiving groove 9.

Although, in the present embodiment, the redistribution pattern 30 is formed within the receiving groove 9 formed at the second surface 2 of the semiconductor chip 10 in order to reduce a thickness of the semiconductor package 100 and prevent deflection of the semiconductor package 100, it may be possible to form the redistribution pattern 30 over the second surface 2 of the semiconductor chip 10 without the receiving groove 9.

Additionally, although metal having low melting point such as a solder is used as the redistribution pattern in the present embodiment, it is also possible to dispose the redistribution pattern 30 over the second surface 2 of the semiconductor chip 10 using a plating method.

Referring to FIGS. 2 and 4, the second insulation layer pattern 8 is disposed over the second surface 2 of the semiconductor chip 10. The second insulation layer pattern 8 includes openings 8a for exposing selectively some part of the redistribution pattern 30.

The conductive ball 8b may be electrically connected to the redistribution pattern 30 exposed by the opening 8a of the second insulation layer pattern 8. The conductive ball 8b may include metal having a low melting point such as a solder. In the present embodiment, considering the case where the redistribution pattern 30 and the conductive ball 8b include a metal having a low melting point such as a solder, the solder included in the redistribution pattern 30 has a first melting point and the solder included in the conductive ball 8b has a second melting point that is lower than the first melting point. Thus, it is possible to prevent the redistribution pattern 30 from melting together with the conductive ball 8b when attaching the conductive ball 8a to the redistribution pattern 30.

Figure 5:
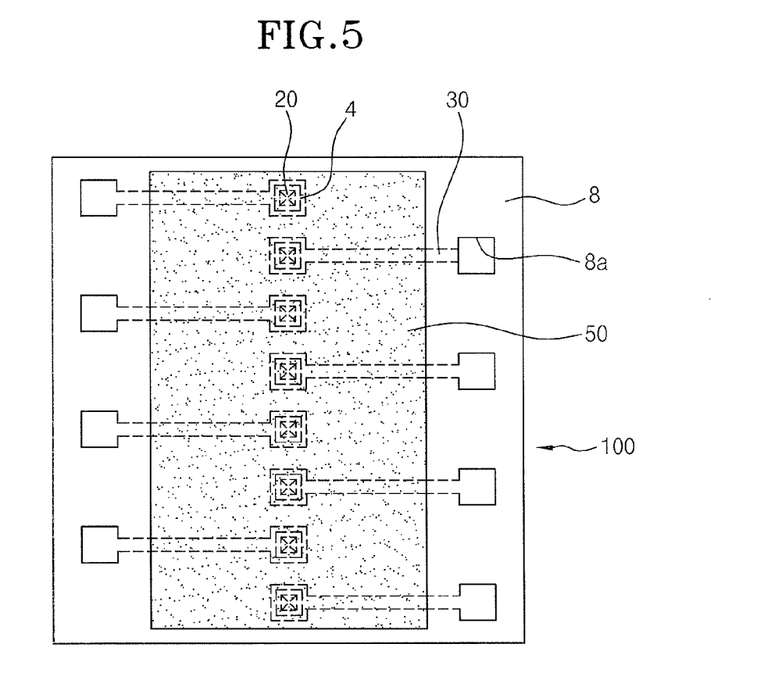
FIG. 5 is a plan view in which an adhesive member is adhered to a semiconductor chip of the semiconductor package shown in FIG. 2.

FIG. 5 is a plan view in which an adhesive member is adhered to a semiconductor chip of the semiconductor package shown in FIG. 2.

Referring to FIG. 5, an adhesive member 50 having a sheet shape is disposed over the second insulation layer pattern 8 disposed over the second surface 2 of the semiconductor chip 10. The adhesive member 50 adheres two semiconductor packages 100 to each other or adheres one semiconductor package 100 to a substrate.

Figure 6:
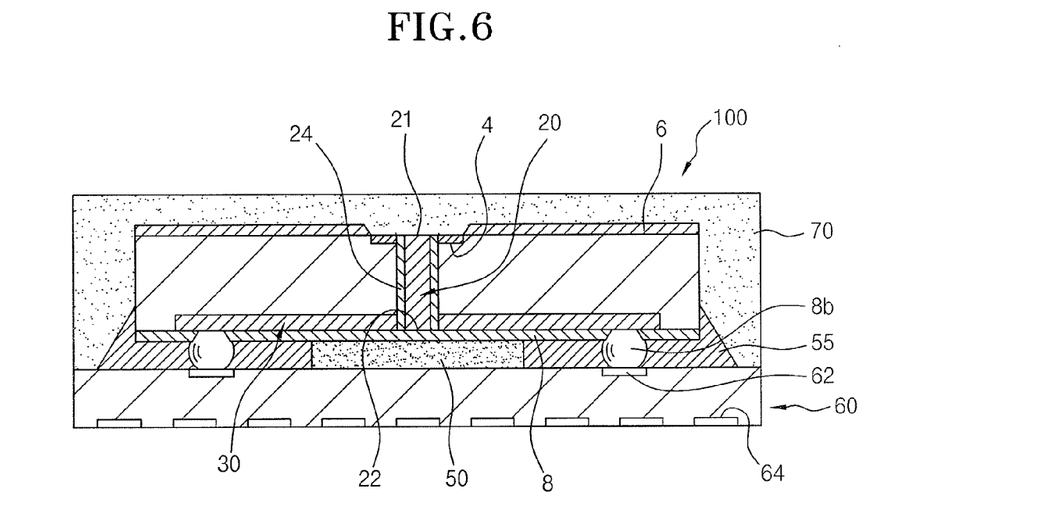
FIG. 6 is a cross-sectional view in which the semiconductor package shown in FIG. 2 is mounted onto a substrate.

FIG. 6 is a cross-sectional view in which the semiconductor package shown in FIG. 2 is mounted onto a substrate.

Referring to FIG. 6, the semiconductor package 100 having the redistribution pattern 30 formed over the second surface 2 of the semiconductor chip 10 is connected with a connection pad 62 formed over a front surface of a substrate 60. The connection pad 62 and the redistribution pattern 30 of the semiconductor package 100 are electrically connected to each other using the conductive ball 8b. Each connection pad 62 is electrically connected to a ball land 64 formed on a rear surface opposing the front surface of the substrate 60. A solder ball may be attached to the ball land 64.

In the case of electrically connecting the connection pad 62 of the substrate 60 to the redistribution pattern 30 of the semiconductor package 100 using the conductive ball 8b, the conductive ball 8b may cause a gap to be formed between the substrate 60 and the semiconductor package 100. In the present embodiment, an under-fill member 55 may be placed in the gap formed by the conductive ball 8b. Also, in order to prevent the semiconductor package 100 mounted onto the substrate 60 from being damaged due to vibration and impact from outside, a molding member 70 including epoxy resin is disposed over the semiconductor package 100.

Figure 7:
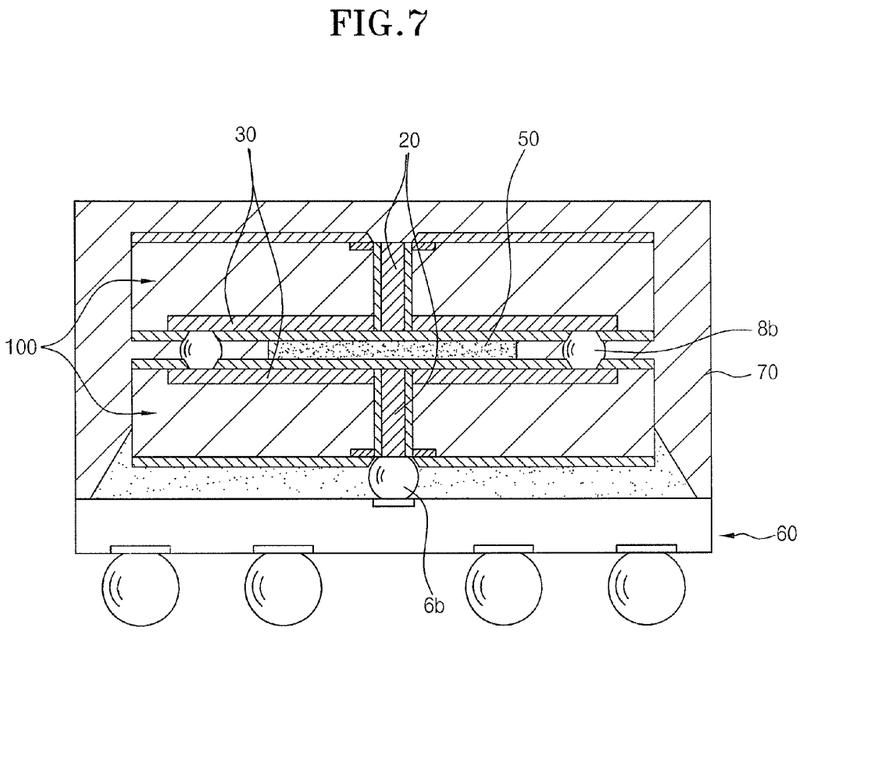
FIG. 7 is a cross-sectional view illustrating a stacked semiconductor package in which at least two semiconductor packages shown in FIG. 6 are stacked.

Although a single semiconductor package 100 is described in the present embodiment, it is possible to realize a stacked semiconductor package, as shown in FIG. 7, by disposing the redistribution patterns 30 of the semiconductor packages 100 so as to oppose each other and connecting electrically the opposing redistribution patterns 30 using the conductive ball 8b.

Figure 8:
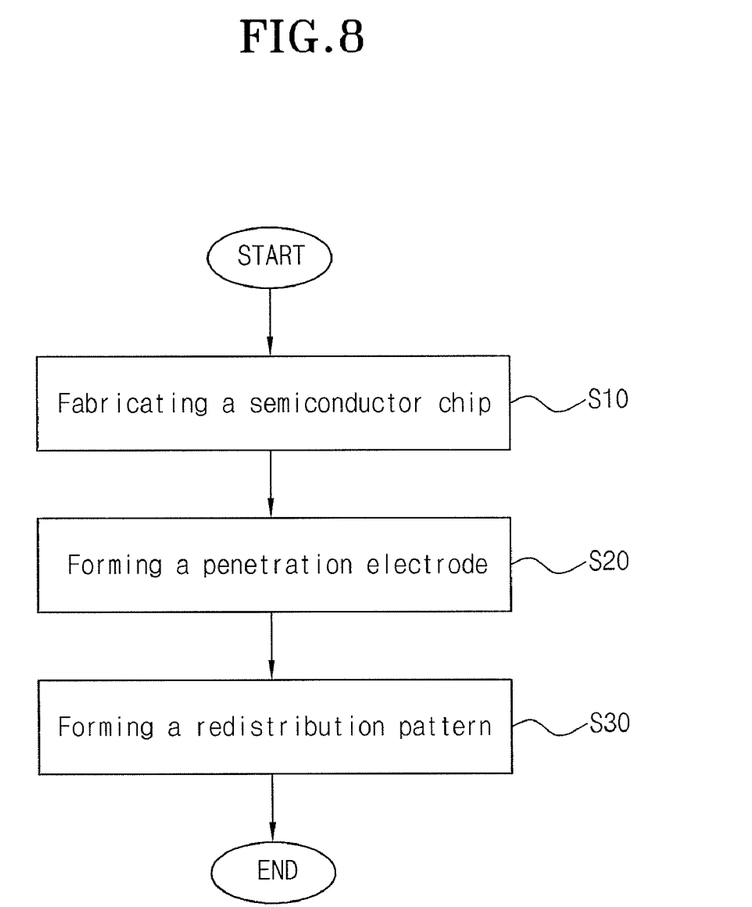
FIG. 8 is a flow chart illustrating a method for fabricating a semiconductor package in accordance with an embodiment of the present invention.

FIG. 8 is a flow chart illustrating a method for fabricating a semiconductor package in accordance with an embodiment of the present invention.

Referring to FIG. 8, the method for fabricating a semiconductor package in accordance with an embodiment of the present invention includes the steps of fabricating a semiconductor chip (S10), forming a through electrode in the semiconductor chip (S20), and forming a redistribution pattern over a rear surface of the semiconductor chip (S30).

Figure 9:
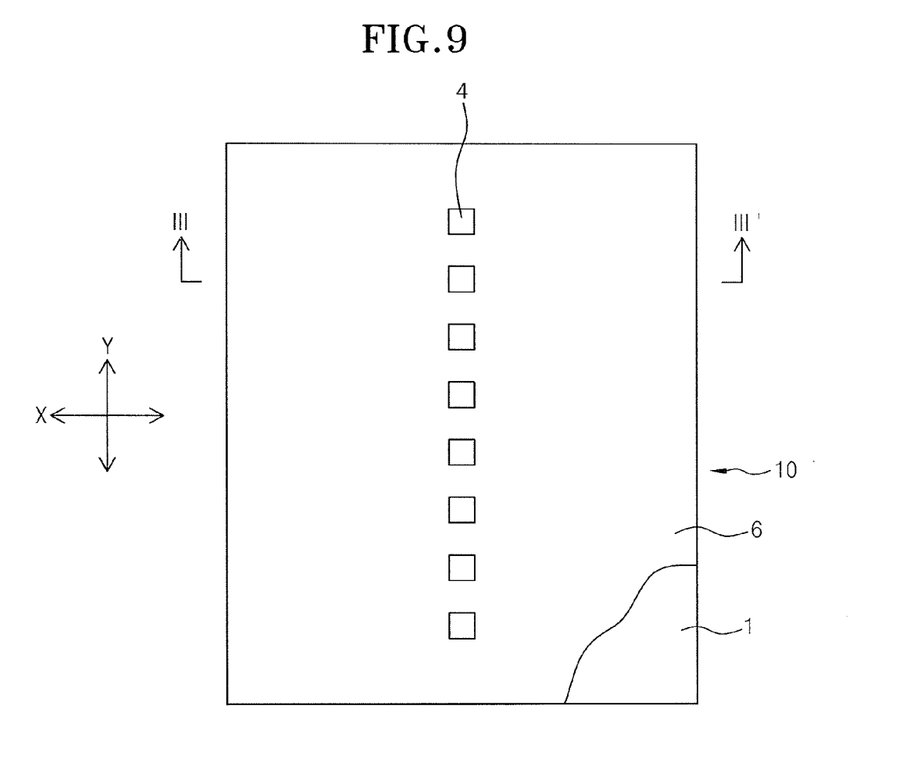
FIG. 9 is a plan view illustrating a semiconductor chip.
Figure 10:
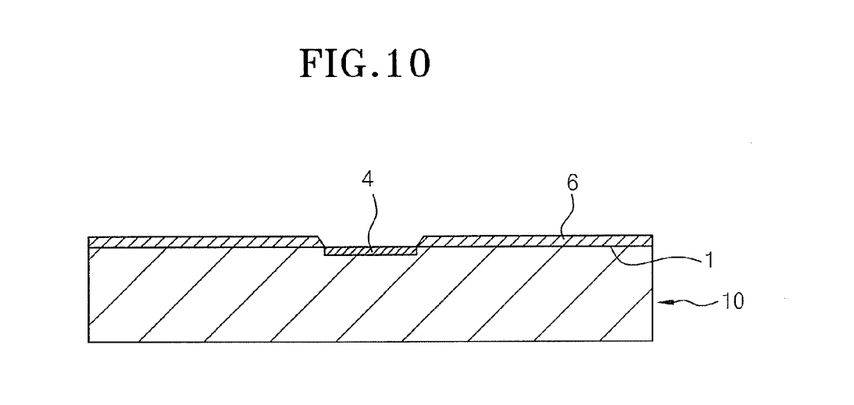
FIG. 10 is a cross-sectional view taken along line III-III' in FIG. 9.

FIGS. 9 and 10 are a plan view and a cross-sectional view illustrating the step (S10) of fabricating a semiconductor chip.

FIG. 9 is a plan view illustrating a semiconductor chip and FIG. 10 is a cross-sectional view taken along line III-III' in FIG. 9.

Referring to FIGS. 8 through 10, in the step S10, a plurality of the semiconductor chips 10 having the data storage part, the data processing part, and the bonding pad 4 are formed over a wafer using a semiconductor device fabrication process. In the present embodiment, the bonding pads 4 are formed, for example, over the first surface 1 of the semiconductor chip 10. The bonding pads 4 are formed, for example, at the center of the first surface 1 in a row along the direction of the Y-axis shown in FIG. 9. Examples of material that may be used as the bonding pad 4 include aluminum, aluminum alloy, and the like.

After the semiconductor chip 10 is fabricated, an organic layer (not shown) is formed over the entire area of the semiconductor chip 10. The organic layer may include an organic matter and a photosensitive substance. The organic layer may be formed by a spin coating process.

After the organic layer is formed over the semiconductor chip 10, the organic layer is patterned by a photo process including an exposure process and a development process, thereby forming the first insulation layer pattern 6 for exposing the bonding pads 4. The first insulation layer pattern 6 is hardened by a bake process.

Figure 11:
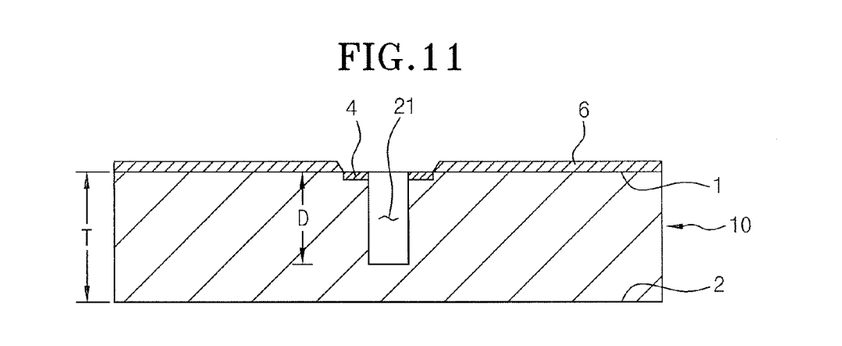
FIG. 11 is a cross-sectional view in which a via hole is formed in a bonding pad of the semiconductor chip shown in FIG. 10.
Figure 12:
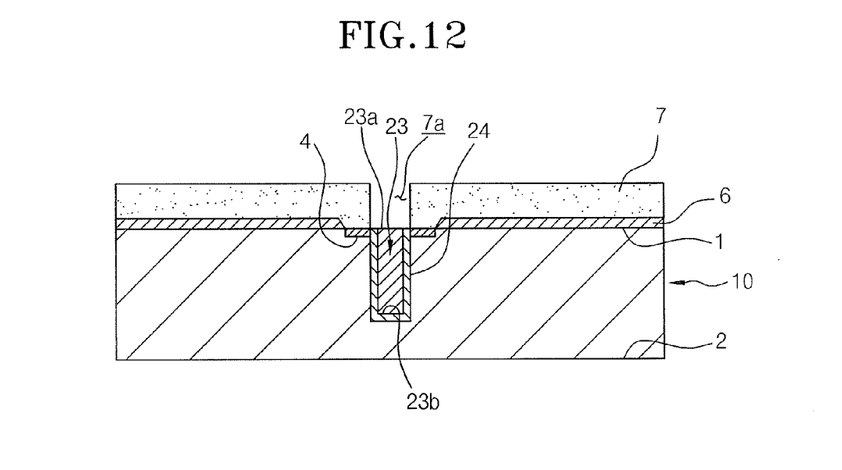
FIG. 12 is a cross-sectional view in which a preliminary through electrode is formed in the via hole shown in FIG. 11.
Figure 13:
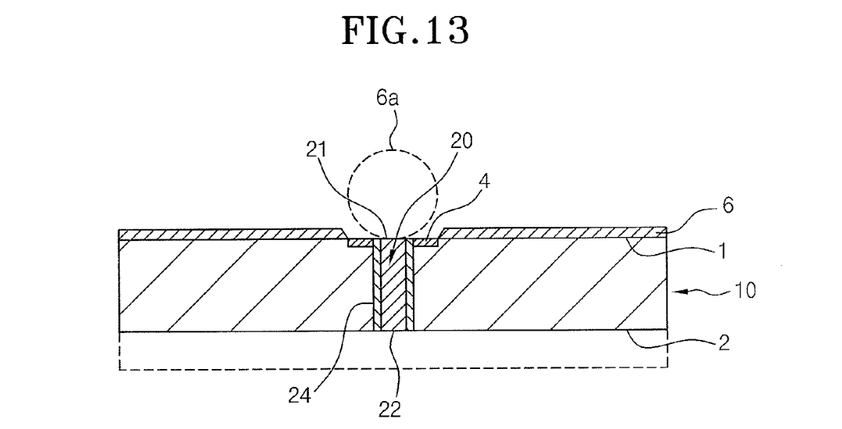
FIG. 13 is a cross-sectional view in which the preliminary through electrode is formed by polishing a rear surface of the semiconductor chip shown in FIG. 12.

FIGS. 11 through 13 are cross-sectional views illustrating the step S20 of forming a through electrode in FIG. 8.

FIG. 11 is a cross-sectional view in which a via hole 21 is formed in a bonding pad of the semiconductor chip shown in FIG. 10.

FIG. 12 is a cross-sectional view in which a preliminary through electrode 23 is formed in the via hole 21 shown in FIG. 11. FIG. 13 is a cross-sectional view in which the through electrode 20 is formed by polishing a rear surface of the semiconductor chip shown in FIG. 12.

Referring to FIG. 11, a via hole 21 is formed in the semiconductor chip 10 in the area corresponding to the bonding pad 4. The via hole 21 is formed from the first surface 1 of the semiconductor chip 10 towards the second surface 2 of the semiconductor chip 10. In the present embodiment, the via hole is formed, for example, so as to pass through the bonding pad 4.

The via hole may be formed by a dry etching process, a drilling process, or a laser drilling process.

A depth D of the via hole 21 is smaller than the thickness T1 of the semiconductor chip 10. It takes a great deal of time to form the through electrode when the depth D of the via hole is deep, whereas it takes a great deal of time to polish the rear surface of the semiconductor chip 10 when the depth D of the via hole is shallow.

Referring to FIG. 12, after the via hole 21 is formed in the semiconductor chip 10, a photoresist film is formed over the entire area of the first surface 1 of the semiconductor chip 10. The photoresist film is patterned using a photo process including an exposure process and a development process, thereby forming a photoresist pattern 7 over the first surface 1 of the semiconductor chip 10. The photoresist pattern 7 has an opening 7a formed at a portion corresponding to the via hole 21.

Using the photoresist pattern 7 as a plating mask, a seed metal pattern 24 is formed over the inside surface of the via hole 21 formed in the semiconductor chip.

The seed metal pattern 24 is formed over the inside surface of the via hole in the semiconductor chip 10 in the case where the through electrode is formed using a plating method. In the case where the through electrode is formed in the via hole 21 through physical vapor deposition process, the seed metal pattern 7 is not formed over the inside surface of the semiconductor chip 10.

Examples of material that may be used as the seed metal pattern 24 include copper, titanium, nickel, vanadium and the like.

After forming the seed metal pattern 24, a preliminary through electrode 23 is formed in the via hole 21 using the seed metal pattern 24. The preliminary through electrode 23 may be formed, for example, by a plating method.

The preliminary through electrode 23 has a first end portion 23a and a second end portion 23b opposing the first end portion 23a. The first end portion 23a is electrically connected to the bonding pad 4.

Referring to FIG. 13, after the preliminary through electrode 23 is formed, the photoresist pattern 7 disposed over the first insulation layer pattern 6 is removed from the first insulation layer pattern 6, for example, by an ashing process and/or a strip process.

Referring to FIG. 13, after the preliminary through electrode 23 is formed, the second surface 2 opposing the first surface 1 of the semiconductor chip 10 is polished, for example, by chemical mechanical polishing (CMP) process, to reduce the thickness of the semiconductor chip 10. The second surface 2 of the semiconductor chip 10 is polished by slurry, etc. until the second end portion 23b (which then becomes the second end portion 22) of the preliminary through electrode 23 formed in the via hole 21 is exposed. Alternatively, the second surface 2 of the semiconductor chip 10 may be etched using an etch back process to reduce the thickness of the semiconductor chip 10. When using the etch back process, the second surface 2 of the semiconductor chip 10 is etched by an etchant or reactive ion until the second end portion 23b of the preliminary through electrode 23 formed in the via hole 21 is exposed.

The second surface 2 of the semiconductor chip 10 is polished or etched to expose the second end portion 23b of the preliminary through electrode 23 from the second surface 2, and thus the through electrode 20 is formed in the semiconductor chip 10.

In the present embodiment, after forming the exposed preliminary through electrode 23 at the first surface 1 of the semiconductor chip 10, the conductive ball 6a may be attached to the first end portion 23a of the preliminary through electrode 23.

Figure 14:
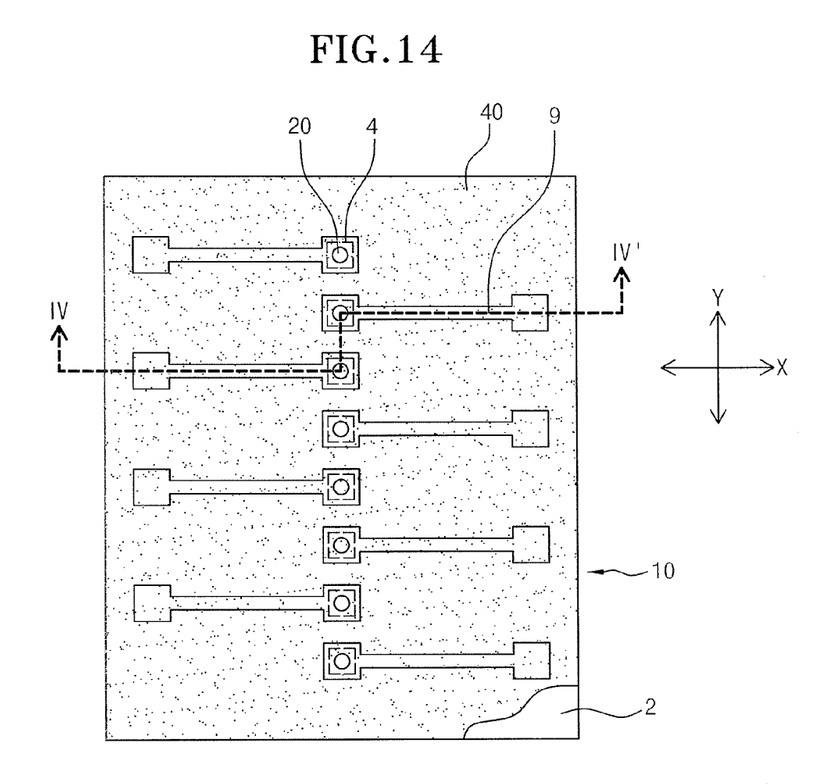
FIG. 14 is a plan view in which a receiving groove is formed in a second surface of the semiconductor chip shown in FIG. 13.
Figure 15:
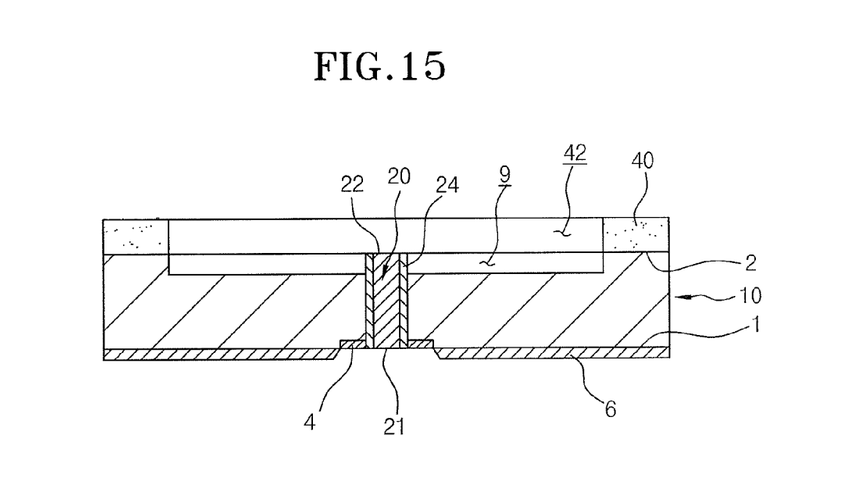
FIG. 15 is a cross-sectional view taken along line IV-IV' in FIG. 14.
Figure 16:
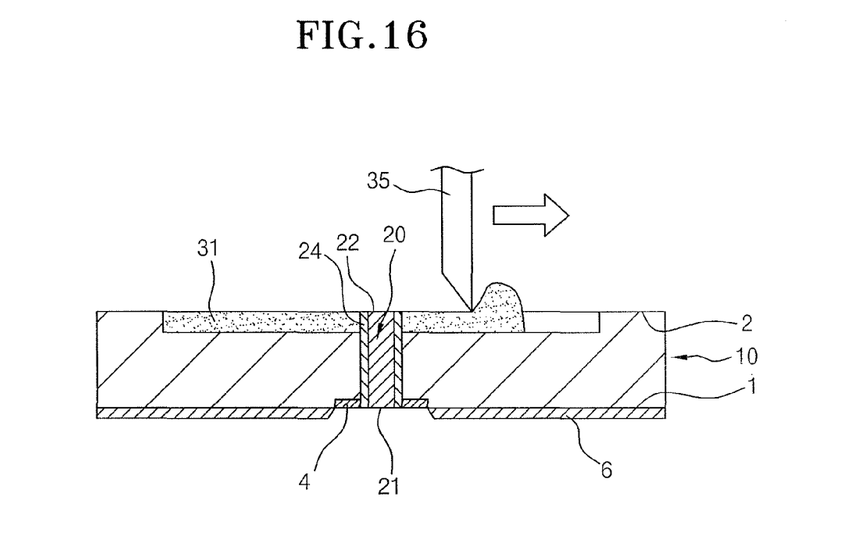
FIG. 16 is a cross-sectional view illustrating a redistribution pattern formed in the receiving groove shown in FIG. 15.

FIGS. 14 through 16 are plan view and cross-sectional views illustrating the step S30 of forming a redistribution pattern shown in FIG. 8.

FIG. 14 is a plan view in which a receiving groove 9 is formed in a second surface 2 of the semiconductor chip 10 shown in FIG. 13. FIG. 15 is a cross-sectional view taken along line IV-IV' in FIG. 14. FIG. 16 is a cross-sectional view illustrating a redistribution pattern formed in the receiving groove 9 shown in FIG. 15.

Referring to FIG. 14, a photoresist film (not shown) is formed over the entire area of the second surface 2 of the semiconductor chip 10.

After the photoresist film is formed, the photoresist film is patterned by a photo process including an exposure process and a development process, and thus a photoresist pattern 40 having an opening 42 is formed over the second surface 2 as shown in FIG. 15.

The opening 42 may have a slit shape when viewed from above. The opening 42 having a slit shape is formed, for example, along a direction of the X-axis shown in FIG. 14.

After the photoresist pattern 40 having the opening 42 is formed, the second surface 2 of the semiconductor chip 2 is patterned using the photoresist pattern 40 as an etching mask, forming the receiving groove 9 at the second surface 2. The receiving groove has substantially the same shape and size as the opening 42 of the photoresist pattern 40. The receiving groove 9 causes the through electrode 20 to project from the bottom surface of the semiconductor chip 10 formed by the receiving groove 9.

After the receiving groove 9 having a predetermined depth is formed in the second surface 2 of the semiconductor chip 10, the photoresist pattern 40 covering the second surface 2 is removed from the second surface 2 by an ashing process or a strip process.

Referring to FIG. 16, after the photoresist pattern 40 is removed from the second surface 2, for example, solder paste 31 having solder is filled in the receiving groove 9. The solder paste may be filled in the receiving groove 9, for example, by a scrapper 35.

Figure 17:
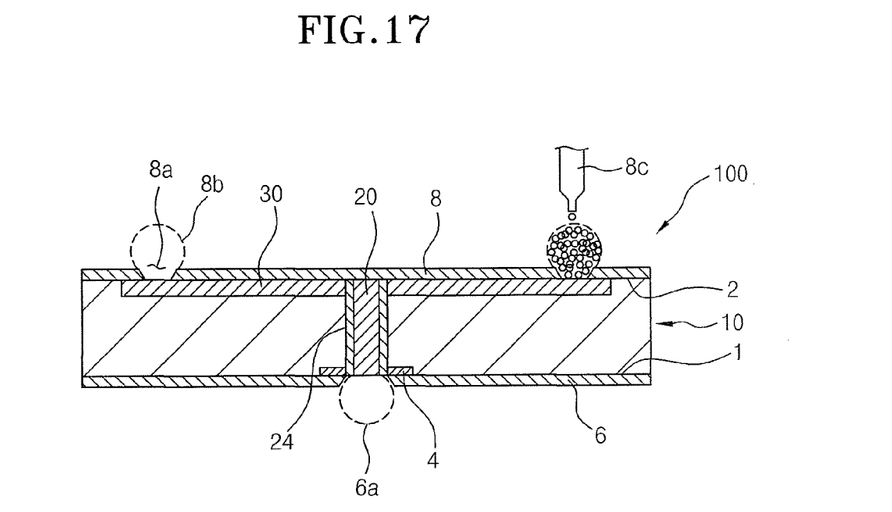
FIG. 17 is a cross-sectional view illustrating the redistribution pattern and a second insulation layer pattern formed in the receiving groove shown in FIG. 16.

FIG. 17 is a cross-sectional view illustrating the redistribution pattern and a second insulation layer pattern formed in the receiving groove.

Referring to FIG. 17, the solder paste 31 filled in the receiving groove 9 has a uniform thickness and is molten, for example, by a reflow process, and thus the redistribution pattern 30 is formed in the receiving groove 9.

After the redistribution pattern 30 is formed, an organic layer (not shown) is formed over the entire area of the second surface 2 of the semiconductor chip 10 formed with the redistribution pattern 30. The organic layer includes, for example, organic matter and photosensitive substance.

The organic layer is patterned by a photo process including an exposure process and a development process. Through this process, a second insulation layer pattern 8 having the opening 8a for exposing a portion of the redistribution pattern 30 is formed over the second surface 2.

After the second insulation layer pattern 8 is formed, using a dispenser 8c solder particles are formed in a ball shape over the opening 8a of the second insulation layer pattern 8. The solder particles having a ball shape are molten by a reflow process forming the conductive ball 8b having a spherical shape. In the present embodiment, the solder included in the redistribution pattern 30 may have a first melting point and the solder particles provided by the dispenser 8c may have a second melting point lower than the first melting point.

After the semiconductor package 100 shown in FIG. 17 is formed, the conductive ball 8b of the semiconductor package 100 may be electrically connected to the substrate 60 having the connection pad 62 as shown in FIG. 6. After the connection pad 62 and the conductive ball 8b are electrically connected, the under-fill member 55 may be filled in the gap formed between the substrate 60 and the semiconductor package 100, and subsequently the molding member 70 for protecting the semiconductor package 100 may be formed.

Although a single semiconductor package 100 is described in the present embodiment, it is possible to fabricate a stacked semiconductor package by disposing the redistribution patterns 30 of the semiconductor packages 100 so that the redistribution patterns oppose each other and connecting electrically the opposing redistribution patterns 30 using the conductive ball 8b (see FIG. 7).

As is apparent from the above description, advantages of the present embodiment include: it is capable of significantly reducing the thickness and volume of the semiconductor package, it is capable of high speed operation of the semiconductor package since the path of the signal inputted and/or outputted from the semiconductor package is shortened, it is possible to easily stack two or more semiconductor packages having a wafer level, and it is capable of significantly reducing parasitic capacitance due to the redistribution pattern of the semiconductor package having the wafer level.

Although a plurality of specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
a semiconductor chip having a bonding pad in a portion of a first surface thereof, and at least one of a data processing part and a data storage part formed at a vicinity of the first surface, wherein a receiving groove having a slit shape is formed in a second surface of the semiconductor chip, the second surface opposing the first surface;
a through electrode passing through the semiconductor chip from the first surface to the second surface opposing the first surface, the through electrode being connected directly and electrically to the bonding pad;
a redistribution pattern disposed at the second surface so as to minimize parasitic capacitance between the at least one of the data storage part and the data processing part and the redistribution pattern, the redistribution pattern being connected electrically to the through electrode and comprising a solder paste completely filling the slit shaped receiving groove formed in the second surface of the semiconductor chip; and
a conductive ball electrically connected to the redistribution pattern;
wherein the solder paste filled in the slit shaped receiving groove so as to form the redistribution pattern has a first melting point and the conductive ball includes a second solder having a second melting point that is lower than the first melting point.

2. The semiconductor package according to claim 1, wherein the semiconductor chip includes a first insulation pattern disposed over the first surface thereof, the first insulation pattern having an opening for exposing the bonding pad.

3. The semiconductor package according to claim 2, wherein the semiconductor chip further includes a conductive ball attached to the bonding pad.

4. The semiconductor package according to claim 1, wherein the semiconductor chip includes a second insulation pattern disposed over the second surface thereof, the second insulation having an opening for exposing a portion of the redistribution pattern.

5. The semiconductor package according to claim 1, wherein the through electrode projects from a bottom surface of the receiving groove.

6. The semiconductor package according to claim 1, wherein the through electrode passes through the bonding pad.

7. The semiconductor package according to claim 1, wherein the semiconductor chip includes an adhesive member disposed over the second surface of the semiconductor chip.

8. The semiconductor package according to claim 1, further comprising a substrate having a connection pad electrically connected to the redistribution pattern.

9. A semiconductor package comprising:
two package units vertically stacked, each package unit comprising:
a semiconductor chip having a bonding pad in a portion of a first surface thereof wherein a receiving groove having a slit shape is formed in a second surface of the semiconductor chip, the second surface opposing the first surface;
a through electrode passing through the semiconductor chip from the first surface to a second surface opposite the first surface, and the through electrode being connected electrically to the bonding pad; and
a redistribution pattern disposed at the second surface, the redistribution pattern being connected electrically to the through electrode and comprising a solder paste completely filling the slit shaped groove formed in the second surface of the semiconductor chip; and
a conductive ball electrically connected to the redistribution pattern of each of the two package units,
wherein the two package units are disposed such that their respective redistribution patterns face each other and the two package units are electrically connected to each other by the conductive ball.

10. The semiconductor package according to claim 1, wherein the semiconductor chip comprises a silicon wafer, and the receiving groove having the slit shape is formed within the silicon wafer.

11. The semiconductor package according to claim 9, wherein each of the two package units comprises a silicon wafer, and the receiving groove having the slit shape is formed within the silicon wafer.

* * * * *